United States Patent
Chen et al.

(10) Patent No.: US 8,610,150 B2
(45) Date of Patent: Dec. 17, 2013

(54) LIGHT-EMITTING DIODE LAMP WITH AN IMPROVED LEADFRAME

(75) Inventors: Wei-An Chen, Hsinchu (TW); Yen-Chih Chou, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 13/325,613

(22) Filed: Dec. 14, 2011

(65) Prior Publication Data

US 2012/0175657 A1 Jul. 12, 2012

(30) Foreign Application Priority Data

Jan. 11, 2011 (TW) .............................. 100100961 A (51) Int. Cl.
*H01L 33/00* (2010.01)

(52) U.S. Cl.
USPC .................... 257/98; 257/79; 257/88; 257/99; 257/669; 257/672; 438/25; 438/26; 438/64

(58) Field of Classification Search
None
See application file for complete search history.

(56) References Cited

U.S. PATENT DOCUMENTS

| 2003/0038596 | A1* | 2/2003 | Ho ................................. 313/512 |
| 2006/0102936 | A1* | 5/2006 | Tomohiro et al. ............. 257/257 |
| 2008/0006837 | A1* | 1/2008 | Park et al. ....................... 257/98 |

FOREIGN PATENT DOCUMENTS

| JP | 2009-283887 | 12/2009 |
| JP | 2010-157682 | 7/2010 |

* cited by examiner

*Primary Examiner* — Kyoung Lee
(74) *Attorney, Agent, or Firm* — Hamre, Schumann, Mueller & Larson, P.C.

(57) ABSTRACT

A leadframe includes two spaced apart conductive legs, each of which includes a base section, and a first extension section extending from a bottom end of the base section in a direction away from the other one of the conductive legs. At least one of the conductive legs further includes a second extension section that extends from a top end of the base section thereof in the same direction as the first extension section for fixing the light-emitting diode chip. The heat generated by the light-emitting diode chip can be dissipated through a shortest heat-dissipating route, thereby increasing the heat-dissipating rate.

19 Claims, 9 Drawing Sheets

LIGHT-EMITTING DIODE LAMP WITH AN IMPROVED LEADFRAME

CROSS REFERENCE TO RELATED APPLICATION

This application claims priority of Taiwanese Application No. 100100961 filed on Jan. 11, 2011.

BACKGROUND OF THE INVENTION

1. Field of the Invention

The invention relates to a light-emitting diode lamp, and more particularly to a leadframe for a light-emitting diode lamp.

2. Description of the Related Art

Figure 1:
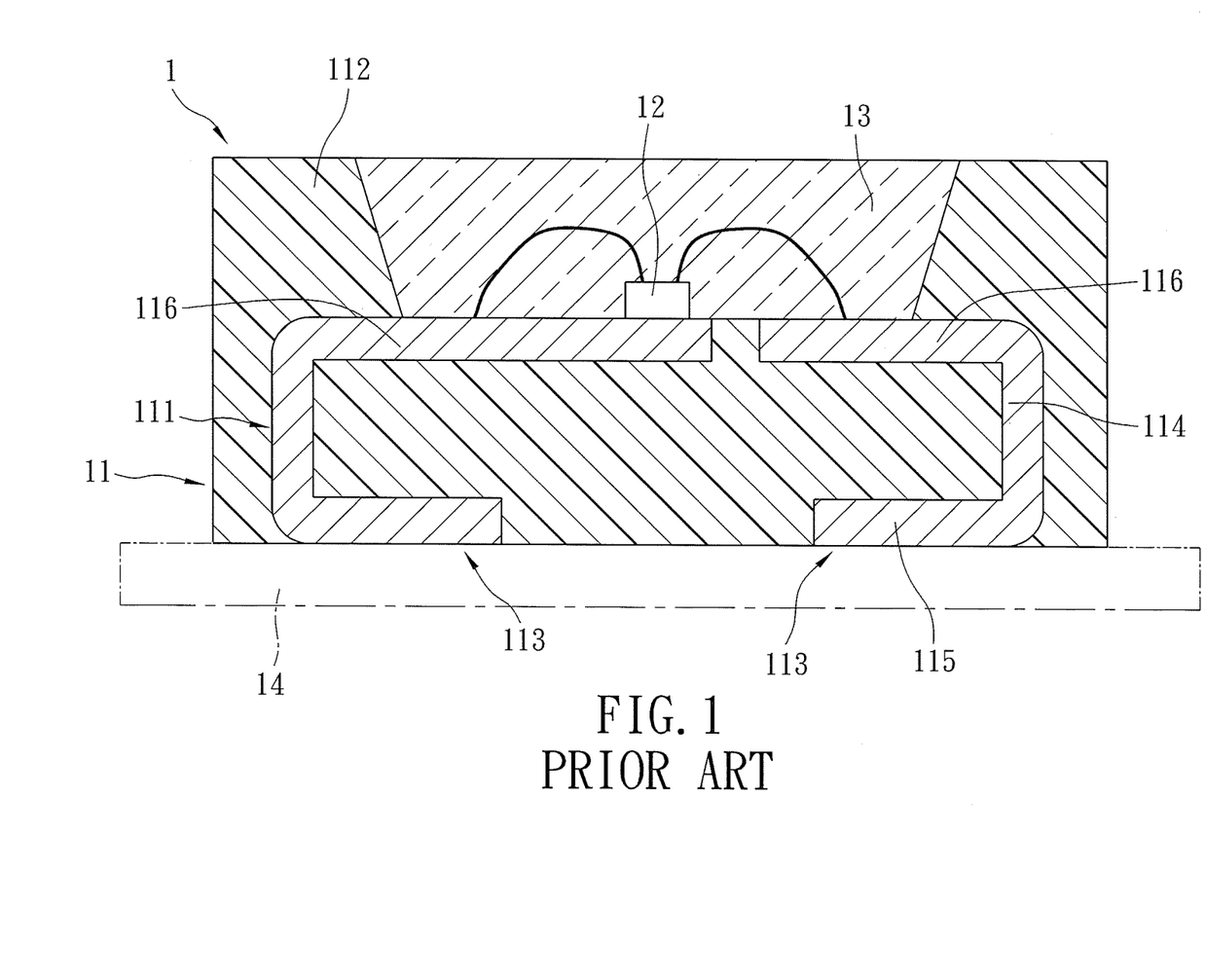
FIG. 1 is a side sectional view of a conventional light-emitting diode lamp.

Referring to FIG. 1, light-emitting diode lamp 1 comprises a packaging cup 11, a light-emitting diode chip 12 and a transparent encapsulant 13.

The packaging cup 11 comprises a leadframe 111 and a cup body 112. The leadframe 111 comprises two spaced apart conductive legs 113, each of which includes a base section 114, and a first extension section 115 extending from a bottom end of the base section 115 in a direction toward the other one of the conductive legs 113, and a second extension section 116 extending from a top end of the base section 115 in a direction toward the other one of the conductive legs 113. The conductive legs 113 are connected electrically and fixed to a conductive substrate 14 (as shown by the dotted lines) for connection with an external power source.

The cup body 112 encloses partially the leadframe 111 and exposes the bottom of the first extension sections 115 of the conductive legs 113 and the top of the second extension sections 116. The cup body 112 and the second extension sections 116 cooperate to define an encapsulant space adapted to fix the light-emitting diode chip 12 to one of the second extension sections 116. The light-emitting diode chip 12 is fixed to one of the second extension sections 116, and the encapsulant 13 is filled in the encapsulant space.

In operation, electric current flows from the conductive substrate 14 to the light-emitting diode chip 12 through the first extension sections 115, the base sections 114 and the second extension sections 116. Heat generated by the light-emitting diode chip 12 transfers from the respective second extension section 116 to the bottom of the first extension section 115 through the base section 114 and is then dissipated from the conductive substrate 14 to the environment.

Since the generated heat transfers along one of the second extension sections 116, to which the light-emitting diode chip 12 is fixed, in a direction away from another second extension 116 to reach the respective base section 114 and the respective first extension section 115 for final discharge to the environment, the path for heat transfer is long and the rate of heat transfer is slow resulting in accumulation of heat and reduction of the service life of the light-emitting diode chip 12. Moreover, due to the accumulated heat, the cup body 112 is prone to deform and change in its intrinsic properties, and can even release toxic gases as a result of chemical reaction caused by heat.

SUMMARY OF THE INVENTION

An object of this invention is to provide an improved leadframe that can increase the rate of heat dissipation for a light-emitting diode.

Another object of this invention is to provide a packaging cup incorporating a leadframe that can increase the rate of heat dissipation for a light-emitting diode.

Yet another object of this invention is to provide a light-emitting diode lamp having a leadframe that can increase the rate of heat dissipation for a light-emitting diode.

A leadframe according to this invention comprises two spaced apart conductive legs, each of which includes a base section, and a first extension section extending from a bottom end of the base section in a direction away from the other one of the conductive legs for electrical connection with an external component. One of the conductive legs further includes a second extension section that extends from a top end of the base section thereof in the same direction as the first extension section thereof and that is adapted to fix the light-emitting diode chip thereto.

A packaging cup for a light-emitting diode chip according to this invention comprises a leadframe and a cup body. The leadframe includes two spaced apart conductive legs, each of which includes a base section, and a first extension section extending from a bottom end of the base section in a direction away from the other one of the conductive legs for electrical connection with an external component. One of the conductive legs further includes a second extension section that extends from a top end of the base section thereof in the same direction as the first extension section thereof and that is adapted to fix the light-emitting diode chip thereto. The cup body encloses partially the leadframe and exposes the first extension sections of the conductive legs, and has an encapsulant space exposing the second extension section and adapted to fix the light-emitting diode chip therein.

A light-emitting diode lamp according this invention comprises a packaging cup, at least one light-emitting diode chip, and a transparent encapsulant. The packaging cup includes a leadframe and a cup body. The leadframe includes two spaced apart conductive legs, each of which has a base section, and a first extension section extending from a bottom end of the base section in a direction away from the other one of the conductive legs for electrical connection with an external component. One of the conductive legs further includes a second extension section that extends from a top end of the base section thereof in the same direction as the first extension section thereof. The cup body encloses partially the leadframe and exposes the first extension sections of the conductive legs to permit the first extension sections to be fixed and connected electrically to the external component, and has an encapsulant space exposing the second extension section of said one of the conductive legs. The light-emitting diode chip is fixed to the second extension section exposed to the encapsulant space, and is connected electrically to both of the conductive legs for emission of light when an electric energy is supplied through the conductive legs. The transparent encapsulant is filled in the encapsulant space to isolate the light-emitting diode chip from a surrounding environment and to permit passage of the light emitted from the light-emitting diode chip to the surrounding environment.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Before the present invention is described in greater detail with reference to the accompanying preferred embodiment, it should be noted herein that like elements are denoted by the same reference numerals throughout the disclosure.

Figure 2:
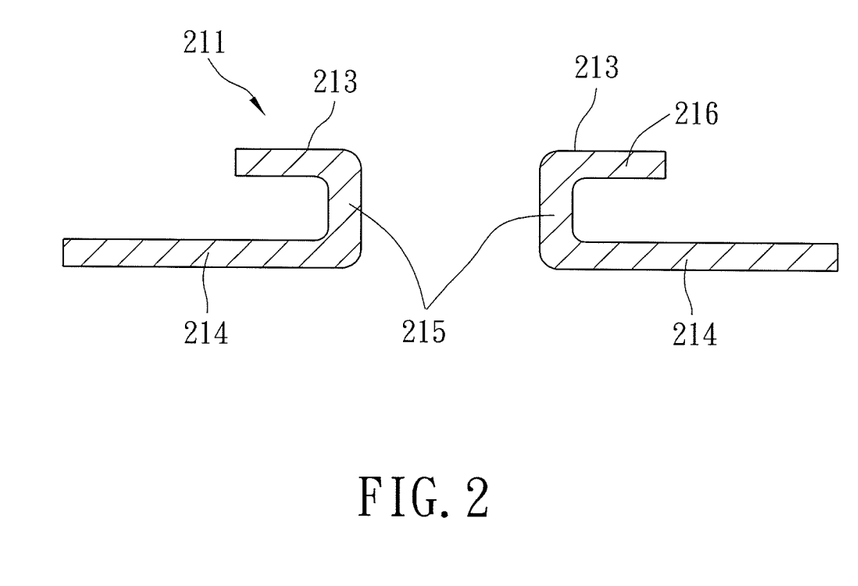
FIG. 2 is a sectional view of a leadframe according to the first preferred embodiment of the present invention.

Referring to FIG. 2, a leadframe 211 according to the first preferred embodiment of this invention, which may be used to carry a light-emitting diode chip 22 (see FIG. 4), includes two spaced apart conductive legs 213 that are made of a metal material and that provide fast heat dissipation characteristics.

Each of the conductive legs 213 includes a base section 215, a first extension section 214 extending from a bottom end of the base section 215 in a direction away from the other one of the conductive legs 213, a second extension section 216 that extends from a top end of the base section 215 in the same direction as the respective first extension section 214 and that is adapted to fix the light-emitting diode chip 22 thereto. Each of the first and second extension sections 214, 216 of each conductive leg 213 define an included angle of about 90 degrees with the respective base section 215.

Figure 3:
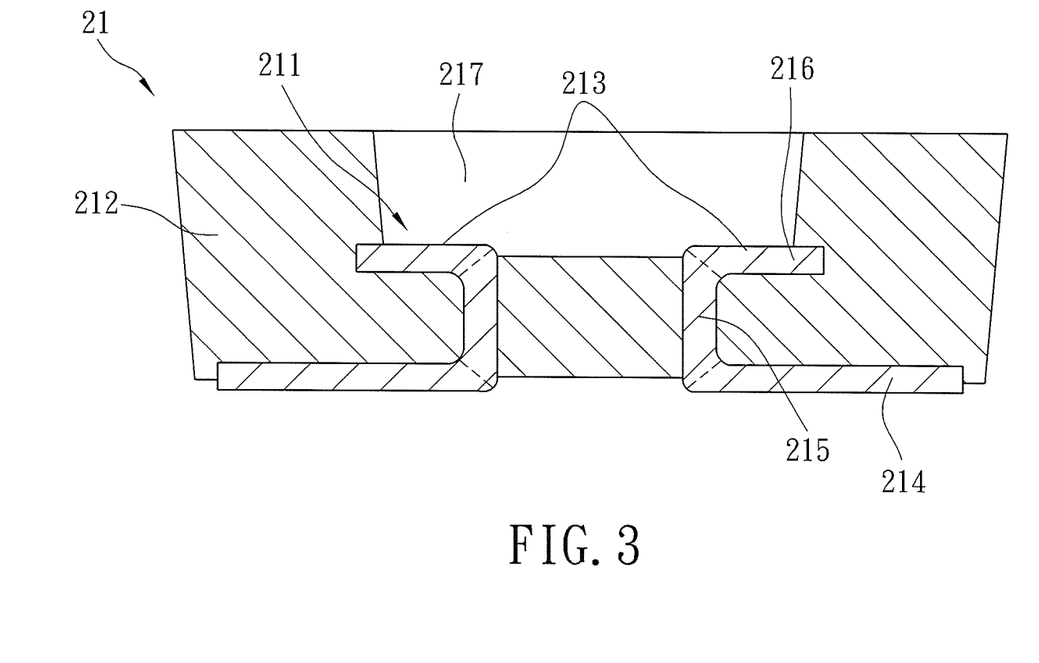
FIG. 3 is a side sectional view illustrating a packaging cup incorporating the first preferred embodiment of a leadframe.

Referring to FIG. 3, a packaging cup 21 includes a cup body 212 molded integrally with the leadframe 211 by insert molding. The cup body 212 encloses the leadframe 211 and exposes the bottoms of the first extension sections 214 of the conductive legs 213, and has an encapsulant space 217 to expose the tops of the second extension sections 216 and to permit connection of the light-emitting diode chip 22 to the second extension sections 216.

Figure 4:
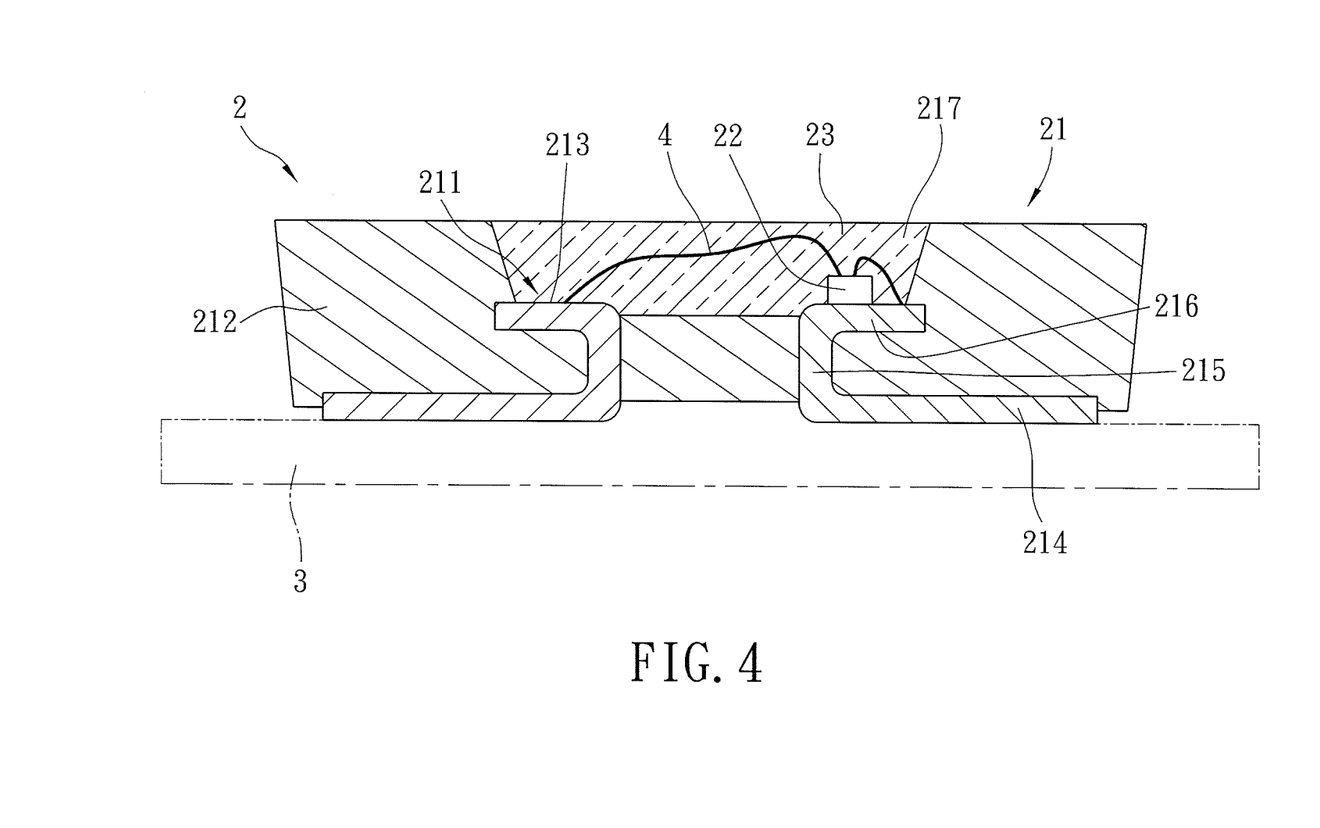
FIG. 4 is a side sectional view for illustrating a light-emitting diode lamp incorporating the first preferred embodiment of a leadframe.

Referring to FIG. 4, the packaging cup 21 is used to package the light-emitting diode chip 22 to form a light-emitting diode lamp 2. Thus, the light-emitting diode lamp 2 includes the leadframe 211, the cup body 212, the light-emitting diode chip 22, and a transparent encapsulant 23.

The light-emitting diode chip 22 is fixed directly to one of the second extension sections 216 and is coupled electrically to the second extension sections 216 through gold wires 4 for emission of light when receiving electric power. The first extension sections 214 are coupled electrically and fixed to a conductive substrate 3 (as shown in dotted lines) so as to receive an external electric power.

The encapsulant 23 is transparent, and is filled in the encapsulant space 217 to isolate the light-emitting diode chip 22 from a surrounding environment and permits passage of the light emitted from the light-emitting diode chip 22 to the surrounding environment.

When an external power source provides power to the first extension sections 214, the electric power flows through the first extension sections 214, the base sections 215 and the second extension sections 216 to the light-emitting diode chip 22. The heat generated by the light-emitting diode chip 22 transfers from the second extension section 216, to which the light-emitting diode chip 22 is attached, to the bottom of the first extension section 214 through the base section 215, and is then dissipated to the environment.

During the transfer of heat along the respective second extension section 216, because the heat is conducted inward and toward the other second extension section 216, rather than in an outward direction away from the other second extension section 216, the length of heat-conducting path from the second extension section 216 to the first extension section 214 is decreased, and the time of heat transfer is reduced, thereby increasing the heat-dissipating rate and the service life of the light-emitting diode chip 22.

It is worth mentioning that the light-emitting diode chip 22 is fixed directly to the second extension section 216 of only one of the conductive legs 213, and is connected electrically to the other one of the conductive legs 213 through the gold wire 4.

The encapsulant 23 may include at least one base material and at least one wavelength converting material. The wavelength converting material may convert a first wavelength light component into a second wavelength light component, and the first and second wavelength light components may be mixed together to form a mixed light. By varying the wavelength converting material, mixtures of different wavelength light components may be provided for the light-emitting diode lamp 2.

The encapsulant 23 may further include light-scattering particles dispersed in the base material so that the light emitted from the light-emitting diode lamp 2 is gentle and homogeneous.

Figure 5:
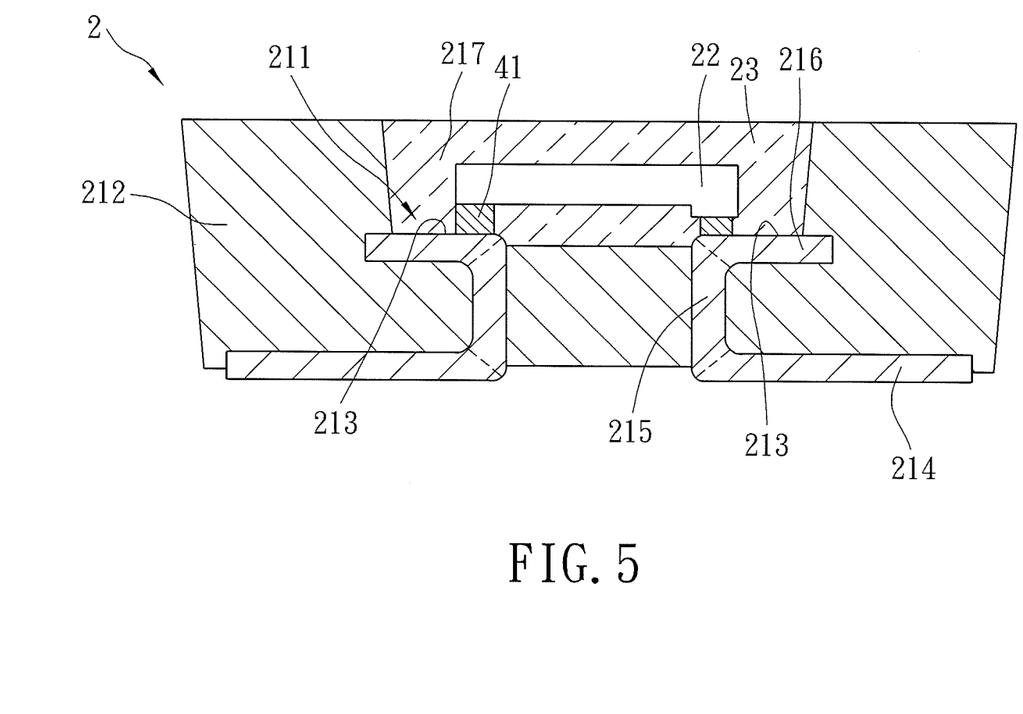
FIG. 5 is a side sectional view illustrating the light-emitting diode lamp incorporating the first preferred embodiment of a leadframe and a light-emitting diode chip with a flip chip connection.

Referring to FIG. 5, the light-emitting diode chip 22 may be mounted on the leadframe 211 through a flip chip connection. In particular, metal balls 41, such as tin balls or copper balls, may be used to fix the light-emitting diode chip 22 to the second extension sections 216 of the conductive legs 213. As such, the gold wire 4 (see FIG. 4) may be dispensed with, the space required for the connection of the light-emitting diode chip 22 may be reduced, and the entire volume or size of the light-emitting diode lamp 2 can be reduced.

Figure 6:
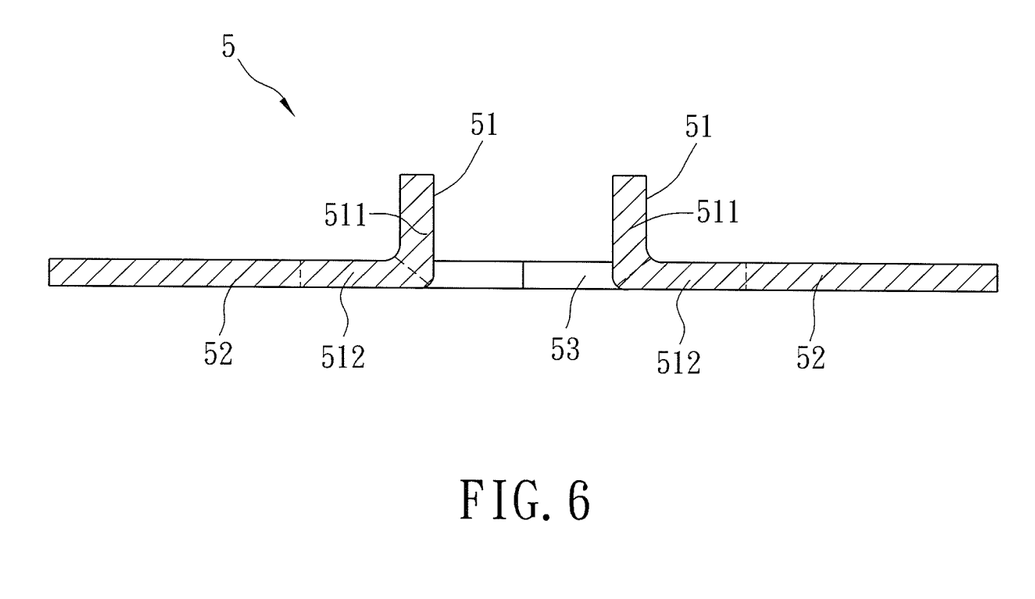
FIG. 6 is a side sectional view for illustrating a metal plate that is stamped and bent to form first parts.
Figure 7:
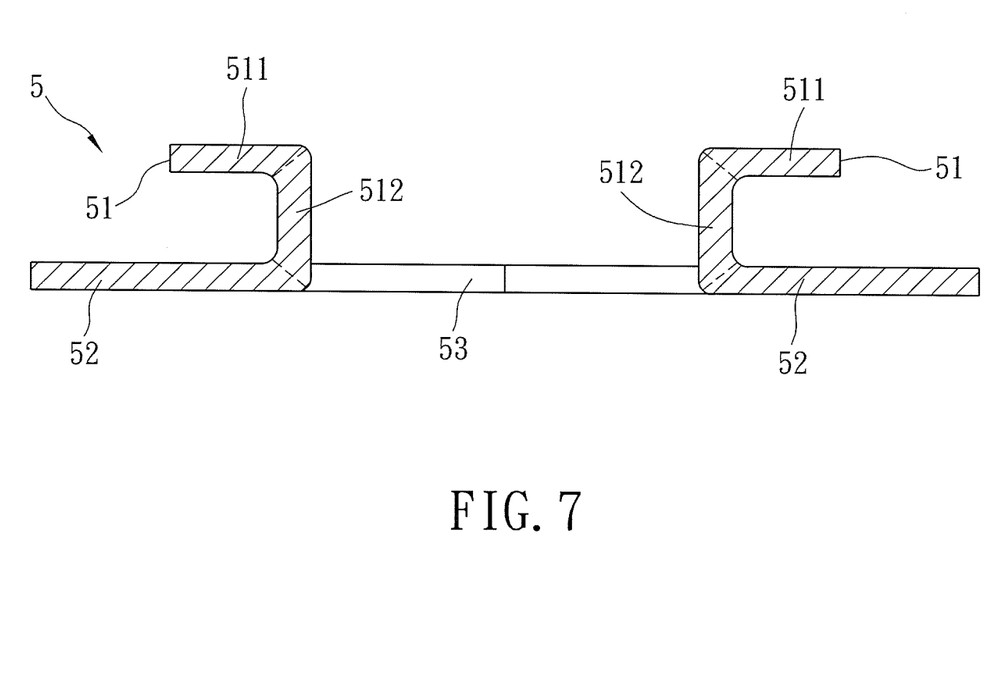
FIG. 7 is a side sectional view illustrating that second regions of the first parts are bent.

Referring to FIG. 6 in combination with FIG. 3, the leadframe 211 may be made by stamping a metal plate 5. Firstly, the metal plate 5 is stamped to form two first parts 51 each having first and second regions 511, 512. Next, the first regions 511 are bent. Referring to FIG. 7, the second regions 512 are subsequently bent to form the second extension sections 216 and the base sections 215 of the conductive legs 213. The second regions 512 are connected respectively to two second parts 52 that form the base sections 215. Two third parts 53 are formed on two opposite sides of the first parts 51.

Figure 8:
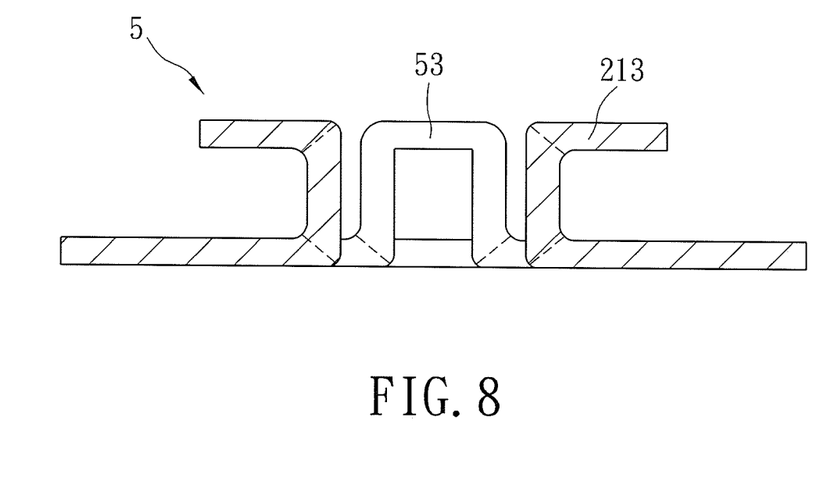
FIG. 8 is a side sectional view illustrating that third parts of the metal plate are folded when the second parts are pushed toward each other.

Referring to FIG. 8, when the two second parts 52 of the metal plate 5 are pushed toward each other, the conductive legs 213 approach each other, and the third parts 53 are bent or folded (an example of the folded configuration is shown in FIG. 8). At this stage, the cup body 212 may be molded over the metal plate 5 by insert molding.

Based on the shape and size of the light-emitting diode chip 22, the distance between the two conductive legs 213 may be easily adjusted by pushing and squeezing the second parts 52 of the metal plate 5. It is not necessary to prepare differently shaped and sized molds for manufacturing the packaging cup 21, thereby simplifying the manufacturing process and lowering the manufacturing costs.

Figure 9:
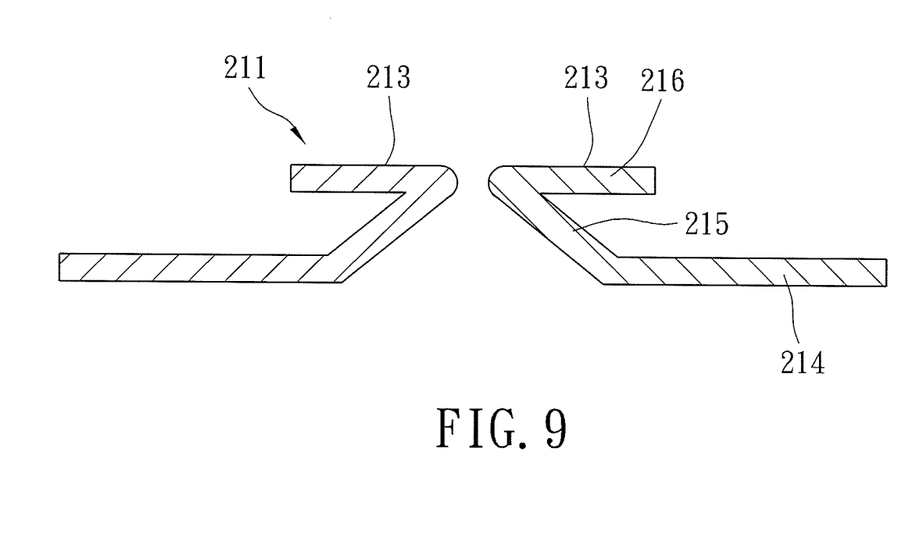
FIG. 9 is a side sectional view illustrating the second preferred embodiment of the leadframe.

Referring to FIG. 9, according to the second preferred embodiment of the present invention, the base section 215 and the second extension section 216 of each conductive leg 213 forms an angle of smaller than 90 degrees. Accordingly, the distance between the second extension sections 216 of the two conductive legs 213 is reduced, and the length of the gold wire 4 needed for electrical connection can be reduced. In addition, because the distance between the first and second extension sections 214, 216 of each conductive leg 213 is also reduced, the height of the light-emitting diode lamp 2 can be lowered.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A leadframe for a connection with a light-emitting diode chip, comprising:
   two spaced apart conductive legs, each of which includes a base section, and a first extension section extending from a bottom end of said base section in a direction away from the other one of said conductive legs, at least one of said conductive legs further including a second extension section that extends from a top end of said base section of said one of said conductive legs in the same direction as said first extension section of said one of said conductive legs and that is adapted to fix the light-emitting diode chip thereto.

2. The leadframe of claim 1, wherein the other one of said conductive legs further includes a second extension section that extends from a top end of said base section of said other one of said conductive legs in the same direction as said first extension section of said other one of said conductive legs and that is adapted for electrical connection with the light-emitting diode chip fixed to said one of said conductive legs.

3. The leadframe of claim 2, wherein said base section and said second extension section of each of said conductive legs define an included angle therebetween, which is smaller than 90 degrees.

4. The leadframe of claim 2, wherein the leadframe is configured as a metal plate, said metal plate including said conductive legs, said metal plate further including a third part that were bent or folded when said conductive legs of the metal plate are pushed toward each other.

5. The leadframe of claim 4, wherein the third part is disposed between the two opposite conductive legs.

6. A packaging cup for a light-emitting diode chip, comprising:
   a leadframe including two spaced apart conductive legs, each of which includes a base section, and a first extension section extending from a bottom end of said base section in a direction away from the other one of said conductive legs, at least one of said conductive legs further including a second extension section that extends from a top end of said base section of said one of said conductive legs in the same direction as said first extension section of said one of said conductive legs and that is adapted to fix the light-emitting diode chip thereto; and
   a cup body enclosing partially said leadframe and exposing said first extension sections of said conductive legs, said cup body having an encapsulant space exposing said second extension sections of said conductive legs and adapted to fix the light-emitting diode chip therein.

7. The packaging cup of claim 6, wherein the other one of said conductive legs further includes a second extension that extends from a top end of said base section of said other one of said conductive legs in the same direction as said first extension section of said other one of said conductive legs, which is exposed to said encapsulant space, and which is adapted for electrical connection with the light-emitting diode chip fixed to said one of said conductive legs.

8. The packaging cup of claim 7, wherein said base section and said second extension section of each of said conductive legs define an included angle therebetween, which is smaller than 90 degrees.

9. The packaging cup of claim 7, wherein the leadframe is configured as a metal plate, said metal plate including said conductive legs, said metal plate further including a third part that were bent or folded when said conductive legs of the metal plate are pushed toward each other.

10. The packaging cup of claim 9, wherein the third part is disposed between the two opposite conductive legs.

11. A light-emitting diode lamp comprising:
    a packaging cup which includes a leadframe and a cup body, said leadframe including two spaced apart conductive legs, each of which has a base section, and a first extension section extending from a bottom end of said base section in a direction away from the other one of said conductive legs for electrical connection with an external component, at least one of said conductive legs further including a second extension section that extends from a top end of said base section of said one of said conductive legs in the same direction as said first extension section of said one of said conductive legs, said cup body enclosing partially said leadframe and exposing said first extension sections of said conductive legs to permit said first extension sections to be fixed and connected electrically to the external component, said cup body having an encapsulant space to expose said second extension sections of said conductive legs;
    at least on light-emitting diode chip fixed to said second extension section exposed to said encapsulant space, and connected electrically to both of said conductive legs for emission of light when an electric energy is supplied through said conductive legs; and
    a transparent encapsulant that is filled in said encapsulant space to isolate said light-emitting diode chip from a surrounding environment and that permits passage of the light emitted from said light-emitting diode chip to the surrounding environment.

12. The light-emitting diode lamp of claim 11, wherein the other one of said conductive legs further includes a second extension section that extends from a top end of said base section of said other one of said conductive legs in the same direction as said first extension section of said other one of said conductive legs and that is exposed to said encapsulant space and that is connected electrically to said light-emitting diode chip fixed to said one of said conductive legs.

13. The light-emitting diode lamp of claim 12, wherein said base section and said second extension section of each of said conductive legs defines an included angle therebetween, which is smaller than 90 degrees.

14. The light-emitting diode lamp of claim 11, wherein said transparent encapsulant includes at least one of a wavelength converting material, and light scattering particles.

15. The leadframe of claim 3, wherein said base section and said first extension section of said one of said conductive legs define an included angle therebetween, which is larger than 90 degrees.

16. The packaging cup of claim 8, wherein said base section and said first extension section of said one of said conductive legs define an included angle therebetween, which is larger than 90 degrees.

17. The light-emitting diode lamp of claim 13, wherein said base section and said first extension section of said one of said conductive legs define an included angle therebetween, which is larger than 90 degrees.

18. The light-emitting diode lamp of claim 12, wherein the leadframe is configured as a metal plate, said metal plate including said conductive legs, said metal plate further including a third part that were bent or folded when said conductive legs of the metal plate are pushed toward each other.

19. The light-emitting diode lamp of claim 18, wherein the third part is disposed between the two opposite conductive legs.

* * * * *